United States Patent [19]

Malaviya

[11] 4,058,808

[45] Nov. 15, 1977

[54] HIGH PERFORMANCE ANALOG TO DIGITAL CONVERTER FOR INTEGRATED CIRCUITS

[75] Inventor: Shashi D. Malaviya, Fishkill, N.Y.

[73] Assignee: International Business Machines Corporation, Armonk, N.Y.

[21] Appl. No.: 779,668

[22] Filed: Mar. 21, 1977

Related U.S. Application Data

[63] Continuation of Ser. No. 489,024, July 6, 1974, abandoned.

[51] Int. Cl.² .......................................... H03K 13/02
[52] U.S. Cl. .................... 340/347 AD; 340/347 SH; 324/111; 324/99 D
[58] Field of Search .... 340/347 M, 347 AD, 347 NT, 340/347 CC, 347 SH; 324/99 D, 111; 307/232

[56] References Cited

U.S. PATENT DOCUMENTS

| | | | |
|---|---|---|---|
| 3,267,458 | 8/1966 | Anderson et al. | 340/347 AD |
| 3,530,458 | 9/1970 | Willard et al. | 340/347 AD |
| 3,541,446 | 11/1970 | Prozeller | 340/347 CC |
| 3,582,947 | 6/1971 | Harrison | 340/347 NT |
| 3,624,500 | 11/1971 | Patzelt | 340/347 AD X |
| 3,678,502 | 7/1972 | Kienzler | 340/347 NT |
| 3,688,221 | 8/1972 | Fruhalf | 340/347 AD UX |
| 3,688,305 | 8/1972 | Goldsworthy | 340/347 NT |
| 3,742,200 | 6/1973 | Marley | 340/347 NT X |

FOREIGN PATENT DOCUMENTS 2,196,559  3/1974  France

OTHER PUBLICATIONS

Challen et al., Phase-Lock-Loop A/D Converter, 1973, IEEE International Solid-State Circuits Conference, pp. 22,23.

Primary Examiner—Thomas J. Sloyan
Attorney, Agent, or Firm—Sughrue, Rothwell, Mion, Zinn and Macpeak

[57] ABSTRACT

An analog to digital converter suitable for fabrication according to integrated circuitry technology. The voltage to be converted is applied to a storage capacitor which is pulse discharged in discrete equal amounts determined by a voltage controlled constant current source. The pulses are counted and the total represents the input voltage. The current of the constant current source, and concomitantly the discrete pulsed discharge amounts, is varied during a calibrate mode depending upon any detected error. A known reference voltage is applied to the storage capacitor which is then pulsed down by the voltage controlled current source. Any deviation in the time of discharge, as compared to the known time (number of pulses) to discharge the capacitor, varies the voltage which controls the current magnitude of the constant current source.

15 Claims, 6 Drawing Figures

HIGH PERFORMANCE ANALOG TO DIGITAL CONVERTER FOR INTEGRATED CIRCUITS

This application is a continuation of Ser. No. 489,024 filed 07/06/74 and now abandoned.

BACKGROUND OF THE INVENTION

The invention is in the field of analog to digital (A/D) converters and is particularly directed to an A/D converter which is suitable for fabrication according to integrated circuit techniques.

There are various types of A/D converters known. These include the single ramp type, the double ramp type, voltage to frequency converters (VCO's), the comparison type which includes a D/A converter and compares the output to the input, etc. All present A/D converters have their respective problems such as inaccuracy, high cost, etc. For example, accuracy is a problem with A/D converters using integrators because of the difficulty in achieving linear ramp voltages and maintaining fixed voltage crossing points. Also VCO's are basically non-linear. Those A/D converters with D/A feedback may be accurate but are relatively expensive.

Substantially all A/D converters have the problem of error due to drift or variation in components and control signals caused by temperature, environment and age variations. Several schemes have been devised to compensate for such errors in various types of A/D converters. Many of these techniques are quite complicated.

An accurate A/D converter that can be integrated into one monolithic chip has been reported by Chellen et al. in a paper given at the IEEE International Solid-State Circuits Conference in Philadelphia in February, 1973. The report appears on page 22 of the proceedings of the conference. The A/D reported utilizes a voltage controlled oscillator responsive to an input and a reference voltage. The VCO output and a submultiple of the system clock are applied to an edge responsive flip-flop whose output in turn controls the application of $V_{REF}$ to the VCO input. The VCO with feedback is used to alter the duty cycle of the flip-flop output in such a way that the duty cycle is a linear function of the input analog signal, i.e., the up-down time ratio is dependent upon the ratio of the input and reference voltages and in that sense the A/D is self-compensating. Accuracy of the system, however, depends upon the ratio of the input resistors to the VCO and on the linearity of the VCO. As is known a VCO is not sufficiently linear for high accuracy, but the authors claim the self-compensating feature compensates to a sufficient degree for the non-linearity of the VCO.

Willard et al., U.S. Pat. No. 3,530,458, teaches an A/D converter with feedback means to compensate for drift in the gain and zero characteristics of the conversion system. However, an integral part of the compensation system is a digital computer, and relays and motor operated rheostats are necessary to alter the input bias resistance (zero characteristic compensation) and to automatically switch tapped resistors (gain characteristic compensation). These elements result in high cost and are not conducive to fabricating the A/D into a simple integrated circuit structure. Furthermore, the system utilizes a voltage to frequency converter which is inherently non-linear. The patent states that the system is only suitable for low frequency input analog voltages, e.g., below 5 Hz.

SUMMARY OF THE INVENTION

It is an object of the present invention to provide a highly accurate self-calibrating A/D converter which can be fabricated entirely in integrated circuit form and can be made relatively inexpensively.

The converter of the present invention eliminates the need for precision matched resistors, operational amplifier integrators, voltage controlled oscillators, and D/A feedback. The invention is self-calibrating to insure that errors normally due to component and/or control voltage variations are entirely eliminated.

Conversion is achieved by pulsing down a storage capacitor having the analog input stored thereon and counting the pulses until the capacitive charge reaches zero. The pulsing down is accomplished by a constant current generator to insure that each pulse removes a constant amount of the charge. Self-calibration is accomplished by applying a known reference voltage to the storage capacitor, determining the offset from the number and phase of the pulses which are required to pulse down the reference voltage and varying the constant current source accordingly. The number of pulses which should be required to pulse down the capacitor during the calibrate mode is known. When that number of pulses is applied, a first input is applied to one input of a phase detector. When the charge on the capacitor reaches zero, a second input is applied to the phase detector. The time difference between the two inputs is a measure of the error. The phase detector provides an output error voltage which controls the constant current source to increase the current if the capacitor is being discharged too slowly and to decrease the constant current source if the capacitor is being discharged too fast.

Amplitude and phase drift of the system clock will have no effect on the accuracy, since the clock pulses gate on the constant current source to discharge a fixed amount of charge irrespective of amplitude variations in the clock pulses, and since the clock pulses are counted by the output counter.

CROSS-REFERENCE TO RELATED APPLICATIONS

This application references and incorporates herein a copending application of S. D. Malaviya entitled, "Improved Phase Discriminator", Ser. No. 415,054, filed Nov. 12, 1973 and assigned to the same assignee as the present application.

DETAILED DESCRIPTION OF THE PREFERRED EMBODIMENT

Figure 1:
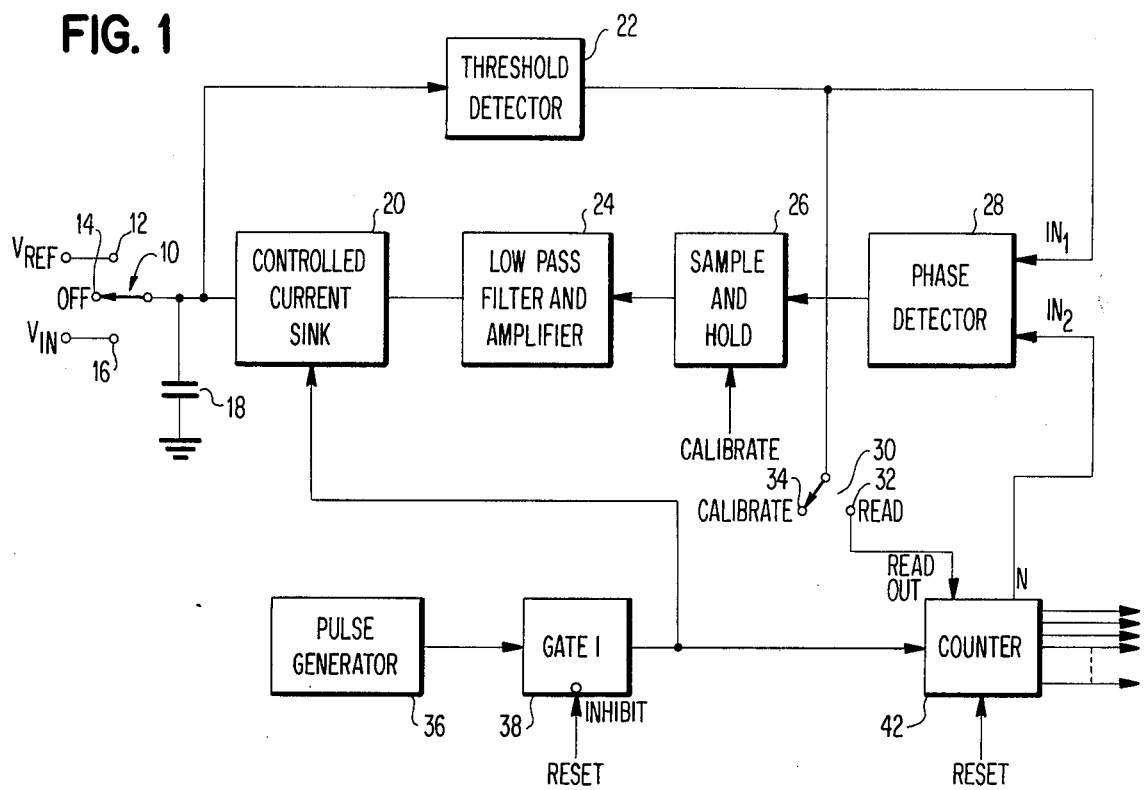
FIG. 1 is a block diagram of a preferred embodiment of the present invention.

A generalized block diagram of the preferred embodiment of the invention, as shown in FIG. 1, operates in two modes — calibrate and read. During the calibrate mode a reference voltage, $V_{REF}$, is measured, and a controlling current source is adjusted. During the read mode, the input voltage is sampled and converted. The modes may occur in alternating sequence but that is not necessary. For example, there may be many read modes between each calibrate operation.

The switches and gating control signals may be generated by any conventional timing means, not shown, driven by the system clock, such as pulse generator 36. Alternatively, the same counter which accumulates the digital value of the analog signals may be used as the timing means for generating the control signals. An example of the latter will be discussed in greater detail in connection with the description of FIGS. 2 and 3.

Referring now to FIG. 1, the storage element is capacitor 18. The analog voltages are stored on capacitor 18 via switch 10. The charge on capacitor 18 is pulsed down by controlled current sink 20 which responds to each pulse applied thereto by discharging the capacitor a fixed amount. The sink 20 is pulsed by a pulse generator 36 via a normally closed gate 38. The pulses from generator 36 are also accumulated by a counter 42. A threshold detector 22 detects when the charge on the capacitor has been reduced to a threshold value, preferably zero volts, and provides an output which is used for calibration during the calibrate mode and the initiating readout of the counter during the read mode.

A phase detector 28 measures the time difference of arrival of inputs $IN_1$ and $IN_2$. Input $IN_1$ arrives when threshold detector 22 detects zero charge on capacitor 18. Input $IN_2$ arrives when counter 42 reaches a count of N which is the predetermined digital number corresponding to the reference voltage. The output of the phase detector 28 is a voltage which varies in magnitude and polarity depending upon the time difference of arrival of the inputs. The latter output is applied to sample and hold circuit 26 which is responsive to the voltage applied thereto only during the calibrate mode. During the read mode the voltage held by the circuit 26 is not varied by any change in the phase detector. The voltage held by sample and hold circuit 26 is applied via low-pass filter and amplifier 24 to the controlled current sink 20. The magnitude of the voltage applied to sink 20 controls the magnitude of the current pulses which the sink 20 draws from capacitor 18 when pulsed by generator 36.

The operation of the A/D converter during the calibrate mode will be described first. For purposes of explanation only it may be assumed that $V_{REF} = +10$ volts and the A/D is adapted to convert analog signals up to +10 volts in increments of 0.01 volts, i.e., a 10 volt input would be converted into a digital count of 1,000. In this case, N = 1,000 and the current sink 20 is set to draw 0.01 volts from capacitor 18 in response to each pulse from generator 36.

Initially, switch 30 is connected to calibrate terminal 34, a calibrate mode input appears at the input of sample and hold circuit 26, switch 10 is connected to terminal 12, and a reset input is applied to normally unblocked gate 38 and counter 42. The position of switch 10 connects $V_{REF}$ to capacitor 18. The latter switch is returned to OFF position 14 after a very brief period which is long enough to charge capacitor 18 to $V_{REF}$. The reset signal resets counter 42 to a start position, e.g., zero, and blocks pulses from generator 36 from passing through gate 38. The sample and hold circuit 26 is controlled to be responsive to the voltage changes at the phase detector output. The threshold detector 22 has a sufficiently high input impedance to prevent discharge of capacitor 18 via the input circuit of detector 22.

Substantially immediately upon the return of switch 10 to the OFF position, the reset signal is removed. The timing is not critical so long as reset is not removed until capacitor 18 has been fully charged. The pulses from generator 36 are now applied to sink 20 and counter 42. Each pulse causes sink 20 to discharge capacitor 18 by 0.01 volts in the example given. When the capacitor is fully discharged the threshold detector provides an output $IN_1$. If the system is error free, the counter will reach a count of N at the same time threshold detector 22 provides the output $IN_1$.

Assuming signals $IN_1$ and $IN_2$ arrive in coincidence the phase detector output does not change and the sample and hold output is not changed. If $IN_1$ arrives in advance of $IN_2$, that indicates that capacitor 18 has been discharged too rapidly. The output of phase detector 28 decreases the voltage held by sample and hold circuit 26 which in turn decreases the current magnitude of current sink 20. Thus, the error has been compensated for the subsequent read cycle or cycles.

If $IN_2$ arrives in advance of $IN_1$, that indicates that capacitor 18 is being discharged too slowly. The phase detector output increases the voltage held by sample and hold circuit 26 to cause a corresponding increase in the magnitude of the current pulses in current sink 20. Thus, the error has been compensated for the subsequent read cycle or cycles.

At the beginning of a read cycle, switch 30 is connected to read terminal 32, the calibrate control signal is removed from sample and hold circuit 26, switch 10 is connected to terminal 16, and the reset control signal is applied to gate 38 and counter 42. Gate 38 is blocked, counter 42 is reset to zero, sample and hold circuit 26 is insensitive to phase detector outputs, and the voltage $V_{IN}$ is applied to the capacitor 18. During the read mode the phase detector may be viewed as being inoperative since its output will have no effect on the system.

After a brief period, long enough to charge capacitor 18 to $V_{IN}$, switch 10 returns to OFF position 14 and the reset control signal is removed from gate 38 and counter 42. Pulses from generator 36 pass through gate 38 and are accumulated by counter 42. Each pulse also causes current sink 20 to discharge capacitor 18 by 0.01 volts. Although temperature supply voltage and device tolerance errors will tend to vary the discrete discharge amount away from the desired 0.01 volts, the correction which is made during calibration brings the discrete amount back to the desired value. When capacitor 18 is fully discharged, threshold detector 22 provides output $IN_1$ which passes through switch 30 and operates to cause readout of the contents of counter 42. The contents of counter 42 at that point in time is the digital equivalent of $V_{IN}$.

It should be noted that the reference voltage need not be equal to the maximum voltage the A/D is adapted to handle. For example, $V_{REF}$ could be 1.0 volts even though the A/D is adapted to convert voltages up to +10 volts. N would be set at 100 rather than 1,000. However, the total count range would still be the same as in the previous example.

Figure 2:
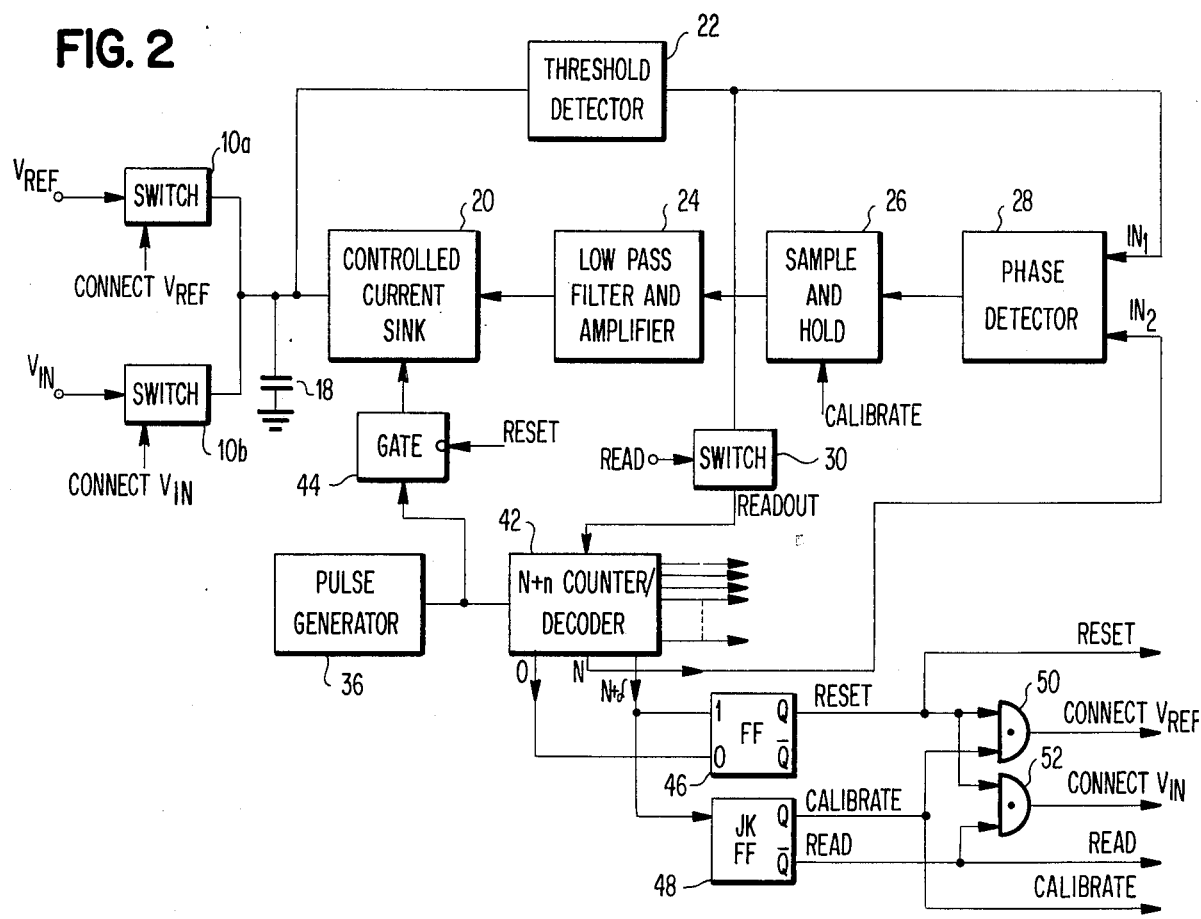
FIG. 2 illustrates a modification of FIG. 1 to permit the counter to control the timing sequence and to provide alternating calibrate and read cycles of operation.

As mentioned above, the switches and the control signals, e.g., reset, calibrate, may be generated by a separate timing means or by the counter 42. Also, as mentioned above, the calibrate and read modes may occur in alternating sequence. FIG. 2 is a modified block diagram illustrating the case where the switches and control signals are generated by counter 42 and associated logic and where the calibrate and read modes are generated in alternating sequence. That part of FIG. 2 which is identical to FIG. 1 will not be described.

It is assumed that counter 42 has a capacity of N+n and that a conventional decoder is associated therewith to provide output pulses when the counter reaches counts of O, N and N+δ, where δ is less than n and is preferably a small positive integer such as 1 or 2. In this case the counter need not be reset by an external signal, although an external signal may be used if desired. Gate 44 of FIG. 2 is substituted for gate 38 of FIG. 1. Switch 30 is illustrated in block form as an electronic switch and switch 10 of FIG. 1 is illustrated in block form as electronic switches 10a, and 10b. The control signals, RESET, CONNECT $V_{REF}$, CONNECT $V_{IN}$, READ and CALIBRATE, are shown in the timing diagram, FIG. 3., and are generated in response to the condition of counter/decoder 42 by a simple logic circuit comprising flip-flops 46, 48 and AND gates 50 and 52.

In the example shown, each mode begins at the count N+δ in counter/decoder 42. The pulses from generator 36 are constantly being accumulated in counter/decoder 42. When counter/decoder 42 is at a count of N+n, the next input pulse recycles the counter/decoder to zero.

For purposes of explanation, assume the counter A/D is in the read mode and the counter is at a count of N. At δ counts later, flip-flop 46 will be set to generate the RESET output, and flip-flop 48 will be toggled to provide the CALIBRATE output. The output CONNECT $V_{REF}$ will also appear at the output of gate 50. Switch 10a will be closed BY CONNECT $V_{REF}$ to connect the reference voltage to capacitor 18. Gate 44 will be opened or blocked by the RESET control signal to prevent pulses from reaching current sink 20, sample and hold 26 is controlled by the CALIBRATE control signal to be responsive to changes in the phase detector output, and switch 30 is blocked or opened by the absence of a READ control signal. As the pulses from generator 36 continue to be accumulated, the counter/decoder will reach a count of N+n and then recycle to a count of zero. At that point, the control signals RESET and $V_{REF}$ are removed. Subsequent pulses are applied via gate 44 to the sink 20, and the calibrate mode continues as described in connection with FIG. 1.

When the counter/decoder next reaches the count of N+δ, the read mode begins. The following control signals will appear; READ, RESET and CONNECT $V_{IN}$. At the subsequent recycling of counter/decoder 42 the control signals RESET and CONNECT $V_{IN}$ are removed and the system begins discharging capacitor 18 in discrete amounts. When capacitor 18 is fully discharged, threshold detector 22 generates $IN_1$ which passes through gate 30 to cause readout of the count in counter/decoder 42. Non-destructive readout is assumed. If desired, the same signal which causes readout of counter/decoder 42 can also be used to reset counter/decoder 42 to a count of N+δ.

Figure 3:
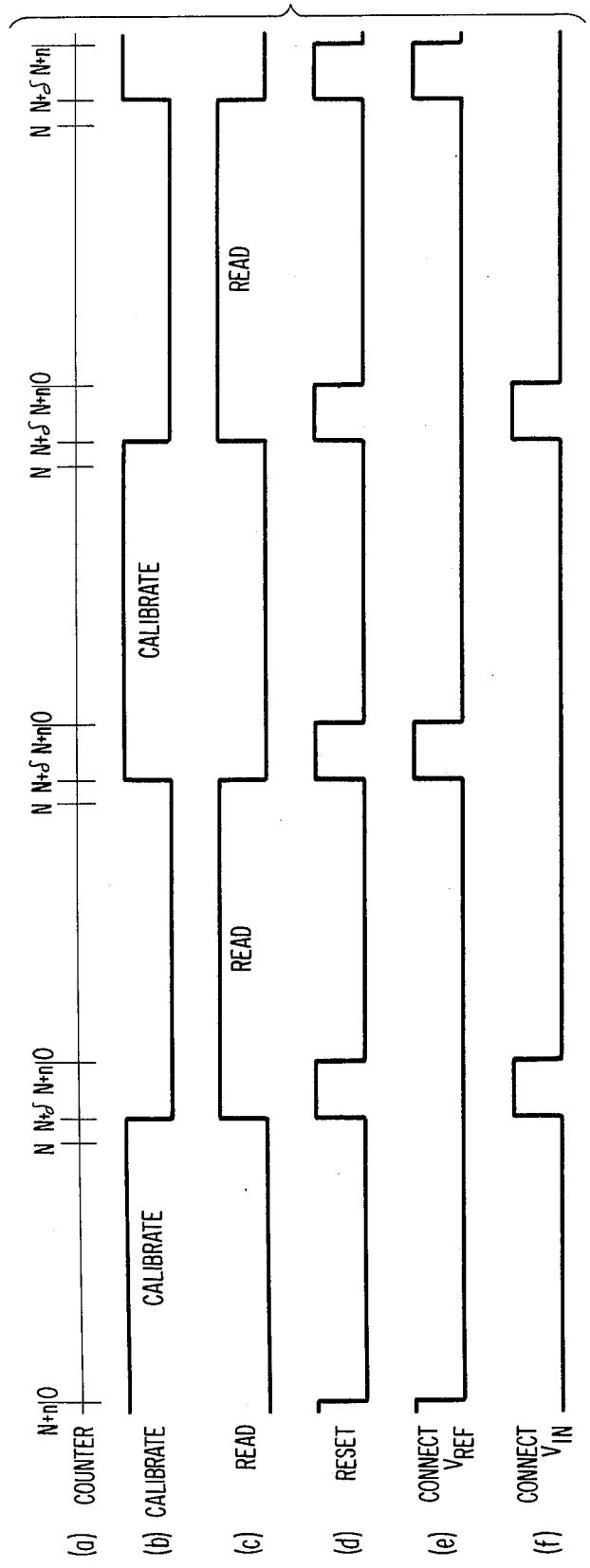
FIG. 3 is a time/waveform graph illustrating the control signals applied in connection with FIGS. 2 and 4.
Figure 4:
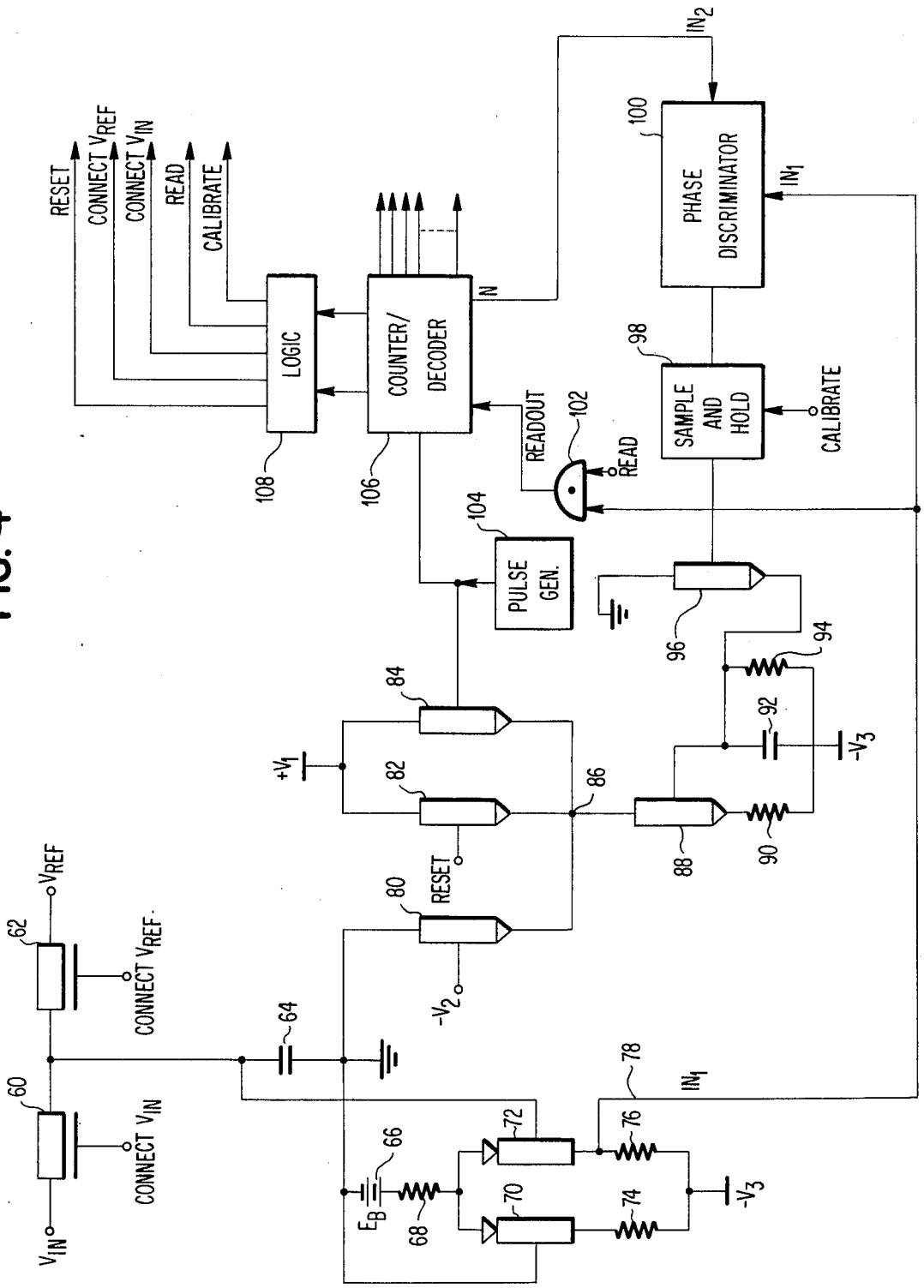
FIG. 4 is a partial schematic, partial block diagram of the apparatus of FIG. 2.

A partial schematic, partial block diagram of a preferred embodiment of the invention is illustrated in FIG. 4. The figure corresponds to that of FIG. 2. The elements shown in block form are very well known in the art and consequently the details thereof are not illustrated herein. It is also known that such circuits are readily fabricated according to integrated circuit techniques. The phase discriminator may be the same as the one disclosed in U.S. Pat. No. 3,870,900 entitled "Phase Discriminator Having Unlimited Capture Range". The control signals and logic for generating same, may be the same as that shown in FIGS. 2 and 3.

The switches which connect $V_{REF}$ and $V_{IN}$ to the storage capacitor 64 are preferably n-channel enhancement field effect transistors of the metal-oxide-semiconductor type. Control signals CONNECT $V_{REF}$ and CONNECT $V_{IN}$ are applied, respectively, to the gate leads of FET devices 60 and 62. The threshold detector is illustrated as a conventional zero crossing detector comprising bipolar pnp transistors 70 and 72, resistors 68, 74 and 76, and voltage sources $E_B$ and $-V_3$. A positive going output voltage appears at the collector of transistor 72 on line 78 when capacitor 64 is discharged to zero. It will be appreciated that any good zero crossing detector can be used in place of the particular one illustrated.

The controlled current sink is illustrated as a conventional constant current source comprising bipolar npn transistor 88 connected to a $-V_3$ source via resistor 90. Emitter follower bipolar npn transistor 96 in combination with resistor capacitor network 94, 92 acts as the amplifier and smoothing filter for the sample and hold output.

The gating means which responds to the pulses from pulse generator 104 to permit the current sink to discharge capacitor 64 in discrete amounts, comprises bipolar npn transistors 80, 82 and 84 which have their emitter leads connected together and to the collector of transistor 88.

The operation during the calibrate cycle will be described first. Counter/decoder 106 advances to a count of N+δ causing logic 108 to generate control signals RESET, CONNECT $V_{REF}$ and CALIBRATE. CONNECT $V_{REF}$ gates on FET 62 to permit capacitor 64 to charge up to $V_{REF}$. There is no leakage of the capacitor charge into the zero crossing detector except for negligable reverse bias leakage in the base-emitter diode of transistor 72. During this period the RESET control applied to the base of transistor 82 turns transistor 82 on to provide a continuous path for the constant current which is continuously drawn by constant current source transistor 88. Transistor 80, having a negative bias of $-V_2$ applied to its base will be non-conducting. Positive pulses applied by generator 104 to the base of transistor 84 will have no effect at this time on transistor 80, but will merely provide an additional current path through transistor 84 for a portion of the constant current drawn by the constant current source. The pulses from generator 104 will be accumulated by counter/decoder 106.

When counter/decoder 106 reaches a count of zero, control signals CONNECT $V_{REF}$ and RESET will be removed, or more accurately stated will drop to low levels, turning off transistors 62 and 82. It may be preferable to turn off transistor 62 before removing the RESET control signal, and this could be simply accomplished by removing the CONNECT $V_{REF}$ control signal at some count prior to zero, e.g., N+n or N+n − 1, etc.

The low level voltage at the base of transistor 82 is assumed to be below $-V_2$. Due to the pulse generator 104 the base of 84 alternates between high and low levels. The high level is assumed above $-V_2$ and the low level is assumed below $-V_2$. Thus, during each pulse interval when the base of 84 is high, the total constant current drawn by transistor 88 will come through transistor 84, and during the portion of each pulse interval that the base of transistor 84 is low, the entire constant current will be drawn through transistor 80, thereby discharging capacitor 64 a discrete amount. As can be appreciated the discrete discharging of capacitor 64 is unaffected by minor amplitude variations in the amplitude level of the pulses supplied by pulse generator 104 since the amplitude of those pulses does not control the magnitude of the current drawn through transistor 80. Also, phase variations in the pulse generator output will not affect measurement because for each discrete discharge of capacitor 64 the accumulator counts one pulse. A variation in the duty cycle of the pulse generator output waveform will affect measurement because it will alter the amount of time during each pulse cycle that charge is drawn off capacitor 64. However, that error as well as others will be compensated by the calibrate mode operation as described previously.

When counter/decoder 106 reaches a count of N, an input $IN_2$ will be applied to phase discriminator 100. When the charge on capacitor 64 reaches zero volts, transistor 72 of the zero crossing detector will conduct thereby raising the voltage on lead 78 and providing the input $IN_1$ to the phase discriminator 100.

If $IN_1$ arrives before $IN_2$, indicating that capacitor 64 has discharged too quickly, phase discriminator produces a negative output voltage having an amplitude proportional to the time difference of arrival of $IN_1$ and $IN_2$. Since the CALIBRATE control signal is high, the discriminator output is added to that held in circuit 98 to lower the held voltage. The base of transistor 96 is lowered and therefore the voltage applied to the base of transistor 88 will also be lowered to reduce the value of the constant current drawn by the constant current source. If $IN_1$ arrives after $IN_2$, indicating the capacitor has discharged too slowly, the discriminator 100 produces a positive voltage output having a magnitude proportional to the time difference of arrival of $IN_1$ and $IN_2$. The value of the current drawn by the constant current source is accordingly increased.

When the counter/decoder 106 reaches $N+\delta$, the logic 108 causes the control signals RESET, CONNECT $V_{IN}$ and READ to go high. Since the CALIBRATE control signal is low, the voltage held by circuit 98 will not respond to outputs from the discriminator 100. Transistor 60 will turn on permitting capacitor 64 to charge to the voltage to be measured, $V_{IN}$. The constant current source will be drawing all its current alternately through transistor 82 alone and transistors 82 and 84 in parallel. When the counter recycles to zero, transistors 60 and 82 will turn off, and capacitor 64 will be pulsed down. When the charge on capacitor 64 reaches zero, transistor 72 of the zero crossing detector will provide the output $IN_1$ which passes through AND gate 102, activated by the presence of the READ control signal, to cause the contents of decoder/counter 106 to be read out.

By adding an extra capacitor in parallel with capacitor 64, the charge/discharge time for the same number of pulses can be made different thereby changing the scale factor of the reference voltage. For example, a system utilizing parallel capacitors of 1 pico farad and 9 pico farads would be adapted to permit scale readings which differ by a factor of 10. Assume that normal range is with the two capacitors connected in parallel. Thus, C = 10 pico farads. A 10 volt signal applied to the capacitor results in a total charge of 100 pico joules (charge = capacitance X voltage). From the prior description it is assumed this charge is reduced to zero by the application of 1,000 current pulses of the constant current. Thus, an output count of 1,000 is read with the decimal place after the first zero, i.e., 10.00 volts.

The range can be changed by a factor of 10 by simple disconnecting the 9 pico farad capacitance. In this case a 100 volt input will result in a change on the capacitor of 100 pico joules and it will take 1,000 pulses to discharge the capacitor. However, now the counter output is read as 100.0 volts. It will be appreciated that more than a single scale factor change is possible. However, the accuracy of the system would now depend upon the accuracy with which the capacitances can be measured. Additionally, an FET may be connected via its drain and source leads in parallel with capacitor 64 to insure complete discharge of capacitor 64 during static testing of the circuits. Such an FET would normally be off and would be turned on by applying a signal to its gate lead as an aid to chip testing.

Figure 5:
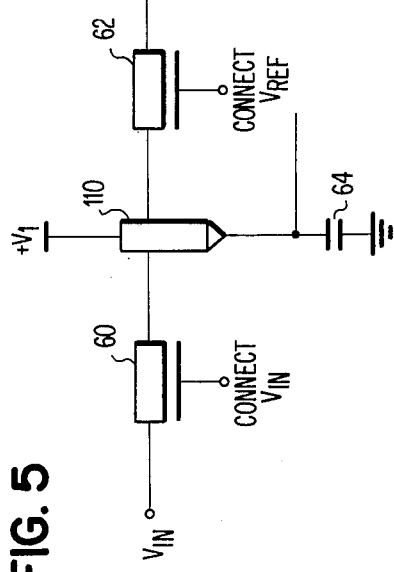
FIG. 5 shows a modification of FIG. 4.

As will be seen from the description of FIG. 4, the terminals $V_{IN}$ and $V_{REF}$ are shorted to capacitor 64 via FET devices 60 and 62. In some cases it may be desirable to provide an additional bipolar transistor between FET devices 60 and 62 and capacitor 64. This would be preferably in the case of a $V_{IN}$ emanating from a high impedance output circuit. This modification is illustrated in FIG. 5. It differs from the previous circuit in that an additional bipolar npn transistor 110 is included. FET devices 60 and 62 are connected to the base of transistor 110, and capacitor 64 is connected to the emitter of transistor 110. The rest of the system may be the same as previously described.

The modification shown in FIG. 5 has one disadvantage. There is a forward voltage drop, $V_{BE}$, across the base-emitter diode of transistor 110. Consequently, the voltages applied to capacitor 64 will be $V_{REF} - V_{BE}$ and $V_{IN} - V_{BE}$, respectively. Thus, the output reading will be off by $V_{BE}$.

The $V_{BE}$ error can be eliminated in several ways. One would be to measure $V_{BE}$ and alter or preset the counter/decoder by the digital count corresponding to $V_{BE}$. For example, instead of using the zero count to initiate pulsing down of the capacitor, the initiation could start at a count corresponding to $V_{BE}$. Thereafter, the subsequent measurement of $V_{IN} - V_{BE}$ would automatically have $V_{BE}$ added to it. Alternatively, the counter output could have added to it the digital measurement of $V_{BE}$. Problems associated with a floating base of transistor 110, if any, can be overcome by grounding the base through another FET during the discharge of capacitor 64.

The same A/D converter as shown may be used to measure $V_{BE}$. The system could be set to the READ mode and a known variable voltage source applied to $V_{IN}$. The voltage input would be decreased until the counter/decoder output reads zero. At that point the input voltage would correspond to $V_{BE}$. The input could then be shorted directly to the capacitor 64, bypassing transistor 110. A subsequent read cycle will provide a digital measurement of $V_{BE}$.

Figure 6:
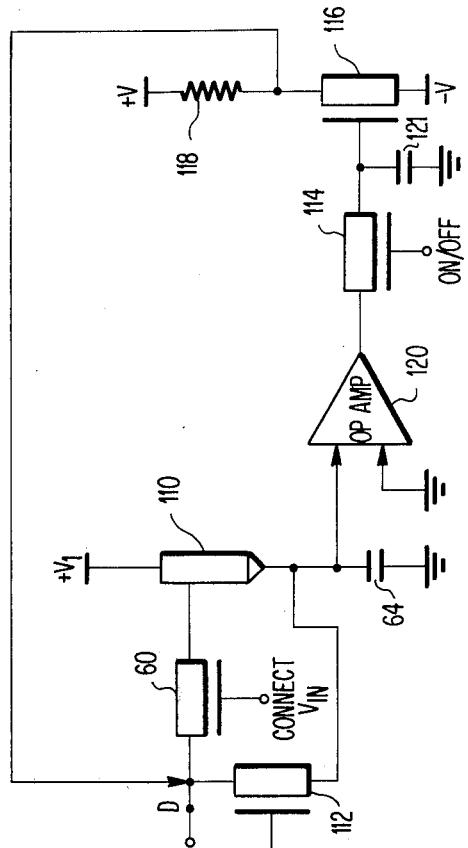
FIG. 6 shows a circuit for permitting automatic measurement of the forward base-emitter voltage drop of an input transistor used in the modification shown in FIG. 5.

The voltage $V_{BE}$ may also be measured automatically and periodically by the circuit modification shown in FIG. 6. It will be noted that for the modification of FIG. 6 the control signals will not occur in the identical sequence as shown in FIG. 3 and it may be preferable to generate the control signals using a separate conventional timing source arranged to provide the control signals at desired relative times. As will be apparent the provision of control signals of desired duration and sequence is a matter well within the skill of the art.

Only so much of the converter needed to explain the modification is shown in FIG. 6. The system now has an additional mode which may be called the measure $V_{BE}$ mode. During this mode $V_{IN}$ is not connected to terminal D. Instead, the voltage at terminal D is forced by a high gain negative feedback loop to assume a voltage of $V_{BE}$. The voltage $V_{BE}$ is then directly connected to capacitor 64 and converted, as in the READ mode, except that instead of reading out the digital equivalent of $V_{BE}$ when $IN_1$ goes high, the digital value $V_{BE}$ will be held in the counter/decoder and will represent the start count of the subsequent READ or CALIBRATE mode. During RESET of the READ or CALIBRATE modes, the counter/decoder, as in the case of FIG. 1, will not be advanced. At the end of RESET, when the voltage on the capacitor ($V_{IN} - V_{BE}$ or $V_{REF} - V_{BE}$) is converted, the counter will start with a count corresponding to $V_{BE}$ and will end with a count corresponding to $V_{IN}$ or $V_{REF}$, as the case may be.

The high gain negative feedback circuit comprises operational amplifier 120, n-channel enhancement type FET devices 114 and 116, capacitor 121 and load resistor 118. Load resistor 118 may be a p-channel FET having its source and gate tied together. The modification also includes an n-channel enhancement type FET device 112.

The measure $V_{BE}$ mode operates as follows. The RESET control signal, not shown, blocks pulses from being applied to the constant current source and the counter. Connect $V_{IN}$ is high to turn on FET 60, FET 114 is turned on, and FET 112 is off. The feedback connection forces node D to a voltage $V_{BE}$ as follows. Because of the extremely high gain of amplifier 120, small negative or positive charges on capacitor 64 are translated into large negative or positive voltages, respectively, at the gate of FET 116. Resistor 118 and FET 116 operate as an inverter. Consequently, a small positive charge on capacitor 64 results in a negative excursion at node D which in turn reduces the charge on capacitor 64. A small negative charge on capacitor 64 results in a positive excursion at node D which in turn increases the charge (reduces the negative charge) on capacitor 64. The circuit will stabilize at a level where the capacitor 64 has zero charge and the voltage at node D will consequently be at $V_{BE}$ above zero. This stabilization of the voltage is one of the well known properties of a system with negative feedback and occurs rapidly. The speed of stabilization can be increased by shunting capacitor 64 with a switchable resistor during the period the feedback circuit is operative. After a brief period, long enough to allow for stabilization, FET 114 is turned off to disconnect the feedback loop, and FET 60 is turned off. The capacitor 121 will cause the voltage at node D to hold at $V_{BE}$. Next, FET 112 is turned on to charge capacitor 64 to $V_{BE}$. FET 112 is turned off, the RESET control signal, not shown, is removed, and $V_{BE}$ is converted as described above. Thereafter, the READ or CALIBRATE mode is initiated with the modifications mentioned at the beginning of the discussion of automatic $V_{BE}$ measurement.

What is claimed is:

1. An analog to digital converter for converting an unknown analog input voltage into a digital equivalent thereof including a calibration means comprising:
   a. storage means,
   b. means for applying said input voltage to said storage means,
   c. means for altering the charge held by said storage means by discrete equal amounts in response to control pulses applied to said means for altering,
   d. means for applying control pulses to said means for altering,
   e. threshold means connected to said storage means for detecting when the charge on said storage means reaches a predetermined threshold value,
   f. accumulator means responsive to the said control pulses for accumulating a number of corresponding to the voltage applied to said storage means,
   g. means for applying a reference voltage to said storage means the resulting charge held by said storage means means again being altered in discrete equal amounts by said means for altering, and
   h. means, responsive to said threshold means and said accumulator means and connected to said means for altering, for comparing the time of detection of said predetermined threshold by said threshold means with a known time corresponding to a number of control pulses nominally required for varying the charge held by said storage means from its initial value when said reference voltage is applied thereto to a value corresponding to said predetermined threshold value, and for varying said discrete amount in accordance with the difference between said time of detection and said known time.

2. An analog to digital converter for converting an unknown analog input voltage into a digital equivalent thereof including a calibration means comprising:
   a. a storage means,
   b. means for applying said input voltage to said storage means,
   c. a voltage controlled constant current source for constantly drawing a current of a magnitude dependent upon a voltage applied at a control input thereof,
   d. means for altering the charge held by said storage means by discrete equal amounts in response to control pulses applied thereto by connecting said voltage controlled constant current source to said storage means during the presence of each control pulse to cause said constant current to flow through said storage means and alter the charge held by said storage means said discrete amount which is dependent upon the magnitude of said constant current,
   e. means for applying control pulses to said means for altering,
   f. threshold means connected to said storage means for detecting when the charge on said storage means reaches a predetermined threshold value,
   g. accumulator means responsive to the said control pulses for accumulating a number corresponding to the voltage applied to said storage means,
   h. means for applying a reference voltage to said storage means, the resulting charge held by said storage means again being altered in discrete equal amounts by said means for altering, and i. means, responsive to said threshold means and connected to said means for altering, for comparing the time of detection of said predetermined threshold by said threshold means with a known time corresponding to a number of control pulses nominally required for varying the charge held by said storage means from its initial value when said reference voltage is applied thereto to a value corresponding to said predetermined threshold value, and for varying said discrete amount in accordance with the difference between said time of detection and said known time.

3. The analog to digital converter as claimed in claim 2 wherein said means for comparing and for varying comprises:
   a. a phase discriminator means having first and second input terminals and responsive to the time difference of arrival of signals at said first and second input terminals for generating an output voltage of a polarity and magnitude dependent upon the said time difference of arrival, and
   b. means connected to the voltage control terminal of said constant current source and the output of said phase discriminator, and having a control input terminal, for varying the voltage applied to said voltage control terminal of said constant current source in accordance with said phase discriminator output voltage when a control signal is applied to said control input terminal, and for holding constant the voltage applied to said voltage control terminal of said constant current source when said control signal is not applied to said control terminal.

4. The analog to digital converter as claimed in claim 3 wherein said threshold means provides an output signal $IN_1$ when said threshold means detects said predetermined threshold value, and further comprising means responsive to said control pulses, during the charge alteration caused by said control pulses being applied to said means for altering, for providing an output signal $IN_2$ after a predetermined number of said control pulses have been applied, said output signals $IN_1$ and $IN_2$ being connected, respectively, to said first and second input terminals of said phase discriminating means, wherein said predetermined number of control pulses is equal to the number of discrete amounts of charge alterations nominally required to alter the charge held by said storage means between a first value thereon immediately after application of said reference voltage, and said threshold value, and wherein the time of generation of said predetermined number of control pulses is said known time.

5. The analog to digital converter as claimed in claim 4 wherein said means for connecting said voltage controlled constant current source to said storage means comprises:
   a. a first bipolar transistor having base, emitter, and collector electrodes, said first transistor being connected between said constant current source and said storage means via said emitter and collector electrodes, said base electrode being connected to a fixed voltage level,
   b. a second bipolar transistor having base, emitter, and collector electrodes, said second transistor being connected between a voltage terminal and said constant current source via said emitter and collector terminals, and
   c. means connecting said control pulses to the base of said second transistor, whereby the presence and absence of said control pulses causes said constant current to flow through said first and second transistors alternately when said means for connecting is not disabled.

6. The analog to digital converter as claimed in claim 5 further comprising means connected to said means for connecting to disable said latter means for the purpose of preventing said means for altering from altering the charge on said storage means while said input voltage $V_{IN}$ or said reference voltage is being applied to said storage means.

7. The analog to digital converter as claimed in claim 6 wherein said means to disable comprises a third bipolar transistor having base, emitter and collector electrodes, said third transistor being connected between said voltage controlled constant current source and a voltage terminal via its emitter and collector electrodes, and a connection to said base terminal adapted to receive a disabling input voltage, whereby a disabling input voltage applied to said connection turns on said third transistor thereby providing a current path for said constant current and preventing said constant current from flowing through said first transistor.

8. The analog to digital converter as claimed in claim 7 wherein said means responsive to said control pulses for providing an output signal $IN_2$ comprises a decoder means in combination with said accumulator means; said decoder means being adapted to provide said output $IN_2$ when said accumulator means accumulates said predetermined number of control pulses.

9. The analog to digital converter as claimed in claim 8 wherein said storage means is a capacitive storage element.

10. The analog to digital converter as claimed in claim 9 wherein said means for applying said input voltage $V_{IN}$ to said storage means is a first FET device having source drain and gate leads, said source and drain leads being connected between an input terminal which $V_{IN}$ is applied and said capacitive storage element, and said gate lead adapted to receive a gating input for turning on said first FET device.

11. The analog to digital converter as claimed in claim 10 wherein said means for applying a reference voltage to said storage means comprises a second FET device having source drain and gate leads, said source and drain leads being connected between a reference terminal to which said reference voltage is applied and said capacitive storage element, and said gate lead adapted to receive a gating input for turning on said second FET device.

12. The analog to digital converter as claimed in claim 9 wherein said means for applying said input voltage $V_{IN}$ to said storage means comprises:
   a. an input terminal adapted to receive said input voltage,
   b. an input bipolar transistor having base, emitter and collector electrodes, said emitter connected to said capacitive storage element, said collector connected to a voltage supply terminal, and
   c. a first FET device having source, drain and gate leads, said FET device being connected between said input terminal and said base electrode of said input bipolar transistor via said source and drain terminals, and said gate lead adapted to receive a gating input for turning on said first FET device.

13. The analog to digital converter as claimed in claim 12 wherein said means for applying a reference voltage to said storage means comprises:
   a. a second input terminal adapted to receive said reference voltage, and
   b. a second FET device having source, drain and gate electrodes, said second FET device being connected between said second input terminal and the base electrode of said input bipolar transistor via its source and drain leads, and said gate lead adapted to receive a gating input for turning on said second FET device.

14. The analog to digital converter as claimed in claim 13 further comprising means for applying to said capacitive storage element a voltage equal to the forward base-emitter voltage drop of said input bipolar transistor.

15. The analog to digital converter as claimed in claim 14 wherein said last mentioned means comprises:
   a. a high gain negative feedback circuit connected between said capacitive storage element and one of said input and second input terminals,
   b. switch means for enabling and disabling said feedback circuit, and
   c. a third FET device having drain, source and gate leads, said third FET being connected between said one terminal and said capacitive storage element, and said gate leads adapted to receive a gating input for turning on said third FET device.

* * * * *

UNITED STATES PATENT AND TRADEMARK OFFICE
CERTIFICATE OF CORRECTION

PATENT NO. : 4,058,808
DATED : November 15, 1977
INVENTOR(S) : Shashi D. MALAVIYA It is certified that error appears in the above-identified patent and that said Letters Patent are hereby corrected as shown below:

IN THE HEADING:

[63] delete "July 6, 1974" insert -- July 16, 1974 --

IN THE SPECIFICATION:

Column 1, line 5 - delete "07/06/74" insert -- 07/16/74 --
Column 3, line 32 - after "and" delete "the" insert -- for --
Column 5, line 39 - delete "BY" insert -- by --

IN THE CLAIMS:

Column 10, line 17 - before "corresponding" delete "of"
Column 10, line 22 - in "storage means means again" delete one "means"
Column 10, line 40 - before "storage" delete "a"
Column 12, line 41 - after "terminal" insert -- to --

Signed and Sealed this

Second Day of May 1978

[SEAL]

Attest:

RUTH C. MASON
Attesting Officer

LUTRELLE F. PARKER
Acting Commissioner of Patents and Trademarks